(12) United States Patent
Iguchi et al.

(10) Patent No.: US 8,736,074 B2
(45) Date of Patent: May 27, 2014

(54) MULTI CHIP SEMICONDUCTOR DEVICE

(75) Inventors: Daisuke Iguchi, Ebina (JP); Kanji Otsuka, Higashiyamato (JP); Yutaka Akiyama, Hachioji (JP)

(73) Assignee: Fuji Xerox Co., Ltd., Tokyo (JP)

( * ) Notice: Subject to any disclaimer, the term of this patent is extended or adjusted under 35 U.S.C. 154(b) by 661 days.

(21) Appl. No.: 12/624,490

(22) Filed: Nov. 24, 2009

(65) Prior Publication Data
US 2010/0289156 A1 Nov. 18, 2010

(30) Foreign Application Priority Data
May 12, 2009 (JP) .................. 2009-115691

(51) Int. Cl.
*H01L 23/48* (2006.01)
*H01L 23/52* (2006.01)
*H01L 29/40* (2006.01)

(52) U.S. Cl.
USPC ........... 257/777; 257/737; 257/738; 257/778; 257/780; 257/E25.006

(58) Field of Classification Search
USPC ................. 257/686, 737, 738, 777, 778, 780, 257/E23.085, E25.027, E25.001, E25.018, 257/E25.013, E25.006, E23.021, E23.033, 257/E23.069, 723, E25.021
See application file for complete search history.

(56) References Cited

U.S. PATENT DOCUMENTS

| | | | | |
|---|---|---|---|---|
| 5,821,625 A | * | 10/1998 | Yoshida et al. ............... | 257/777 |
| 6,444,493 B1 | * | 9/2002 | Feil et al. ..................... | 438/108 |
| 6,790,704 B2 | * | 9/2004 | Doyle et al. .................. | 438/109 |
| 2004/0142540 A1 | * | 7/2004 | Kellar et al. .................. | 438/455 |
| 2005/0046037 A1 | * | 3/2005 | Franzon et al. ............... | 257/777 |
| 2006/0094206 A1 | * | 5/2006 | Nishimura et al. ........... | 438/455 |
| 2006/0226527 A1 | * | 10/2006 | Hatano et al. ................ | 257/686 |
| 2006/0234405 A1 | * | 10/2006 | Best ............................... | 438/15 |
| 2007/0029646 A1 | * | 2/2007 | Voldman ....................... | 257/662 |
| 2007/0289772 A1 | | 12/2007 | Kuroda et al. | |
| 2008/0150157 A1 | * | 6/2008 | Nishimura et al. ........... | 257/777 |

FOREIGN PATENT DOCUMENTS

| | | |
|---|---|---|
| JP | 2005-203657 A | 7/2005 |
| JP | 2005-228981 A | 8/2005 |

OTHER PUBLICATIONS

Stephen Mick, et al; "Buried Bump and AC Coupled Interconnection Technology"; IEEE Transactions on Advanced Packaging, vol. 27, No. 1; Feb. 2004; pp. 121-125.

* cited by examiner

*Primary Examiner* — Teresa M Arroyo
(74) *Attorney, Agent, or Firm* — Sughrue Mion, PLLC

(57) ABSTRACT

According to an aspect of the invention, a semiconductor device includes a substrate having an opening area, a first semiconductor chip, and a second semiconductor chip. The first semiconductor chip has a first electrode for high-speed communication and that is disposed around the opening area on the substrate. The second semiconductor chip has a second electrode and third electrode for power and low-speed communication and that is disposed on the first semiconductor chip so that the first electrode is coupled with the second electrode by electrostatic coupling and dielectric coupling, the third electrode facing the opening area.

7 Claims, 10 Drawing Sheets

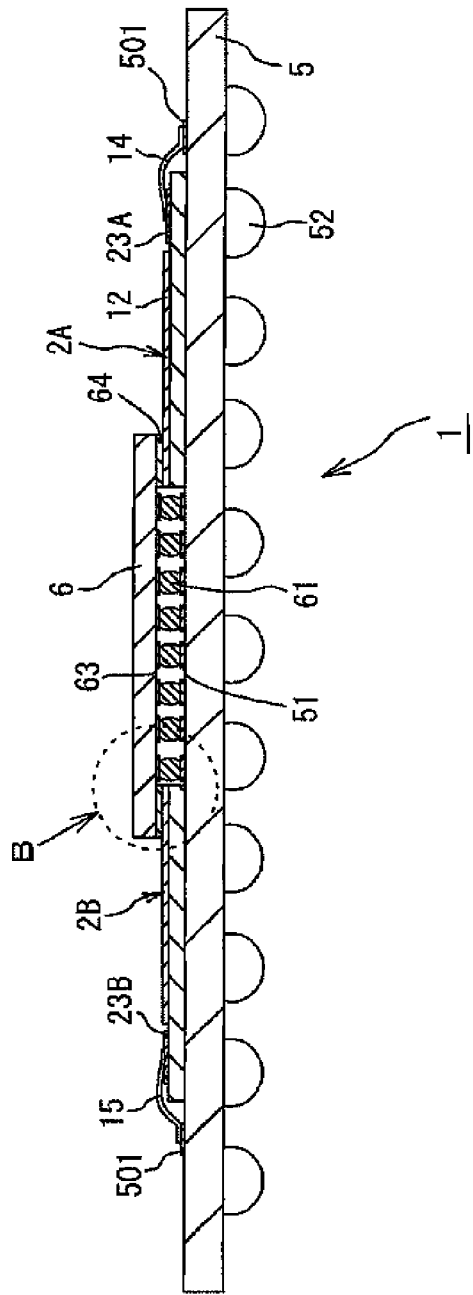
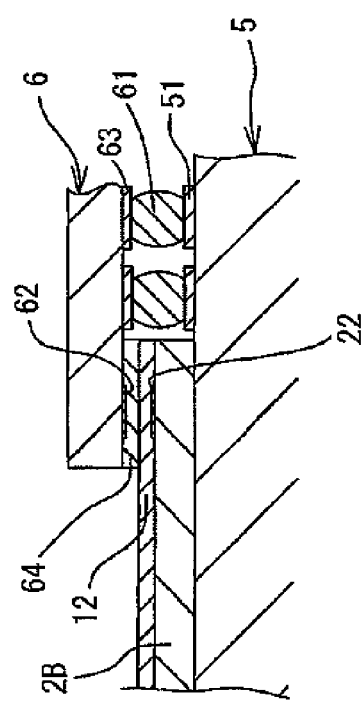
FIG. 4A
FIG. 4B

MULTI CHIP SEMICONDUCTOR DEVICE

CROSS-REFERENCE TO RELATED APPLICATIONS

This application is based upon and claims priority under 35 USC 119 from Japanese Patent Application No. 2009-115691, filed May 12, 2009.

BACKGROUND

1. Technical Field

The present invention relates to a semiconductor device.

2. Related Art

There are growing demands for the miniaturization and higher integration of semiconductor integrated circuits.

However, there is not only a physical limitation on such miniaturization, but also a requirement that a large amount be invested in facilities. Moreover, costs, including labor and research and development, corresponding to the increasingly complicated design are significantly increased. For this reason, three-dimensional IC technology or multi-chip module (MCM) technology has been proposed.

SUMMARY OF THE INVENTION

According to an aspect of the invention, a semiconductor device includes a substrate having an opening area, a first semiconductor chip, and a second semiconductor chip. The first semiconductor chip has a first electrode for high-speed communication and that is disposed around the opening area on the substrate. The second semiconductor chip has a second electrode and third electrode for power and low-speed communication and that is disposed on the first semiconductor chip so that the first electrode is coupled with the second electrode by electrostatic coupling and dielectric coupling, the third electrode facing the opening area.

BRIEF DESCRIPTION OF THE DRAWINGS

Exemplary embodiments of the invention will be described in detail based on the following figures, wherein:

FIG. 4A is a cross-sectional view taken along the line A-A of the semiconductor device shown in FIG. 1;

FIG. 4B is an enlarged view showing a B portion shown in FIG. 4A;

FIG. 7A is a plan view showing a state where semiconductor chip groups other than an MPU are provided in a wafer, FIG. 7B is a plan view showing a state where an MPU group is provided in a wafer, FIG. 7C is a view showing a state where the two wafers are bonded to each other, and FIG. 7D is a cross-sectional view taken along the line C-C in a completed semiconductor device of FIG. 7C;

FIG. 8A is a bottom view and FIG. 8B is a cross-sectional view taken along the line D-D;

FIG. 9A is a bottom view and FIG. 9B is a cross-sectional view taken along the line E-E.

DETAILED DESCRIPTION

[First Exemplary Embodiment]

Figure 1:
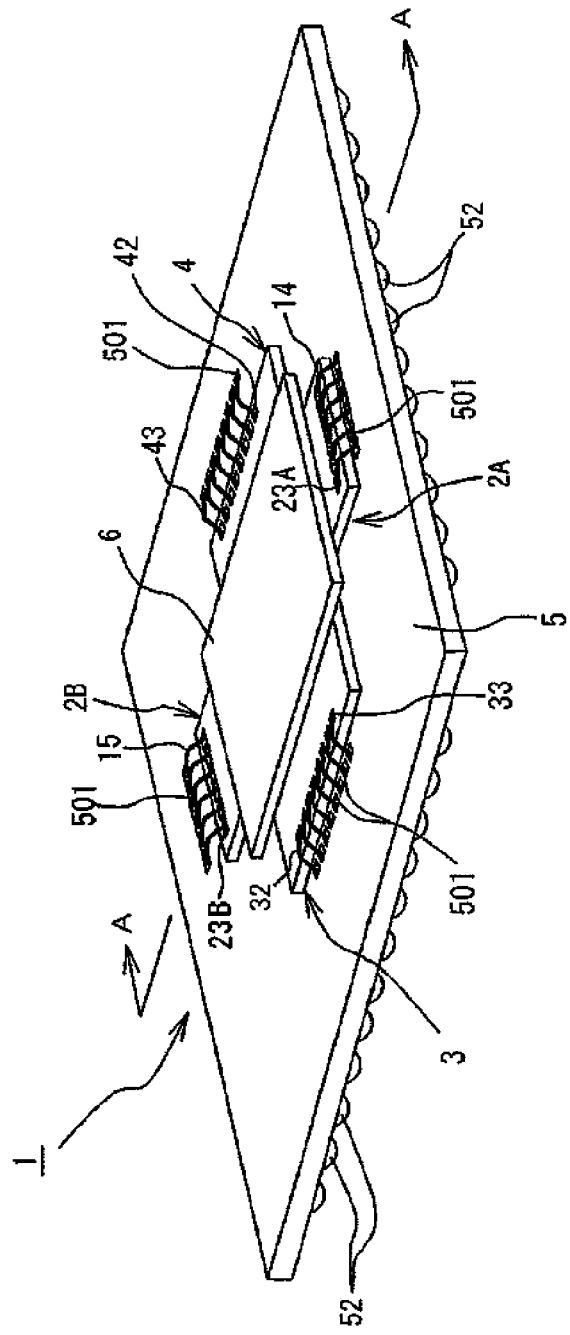
FIG. 1 is a perspective view showing a semiconductor device according to a first exemplary embodiment of the invention.
Figure 2:
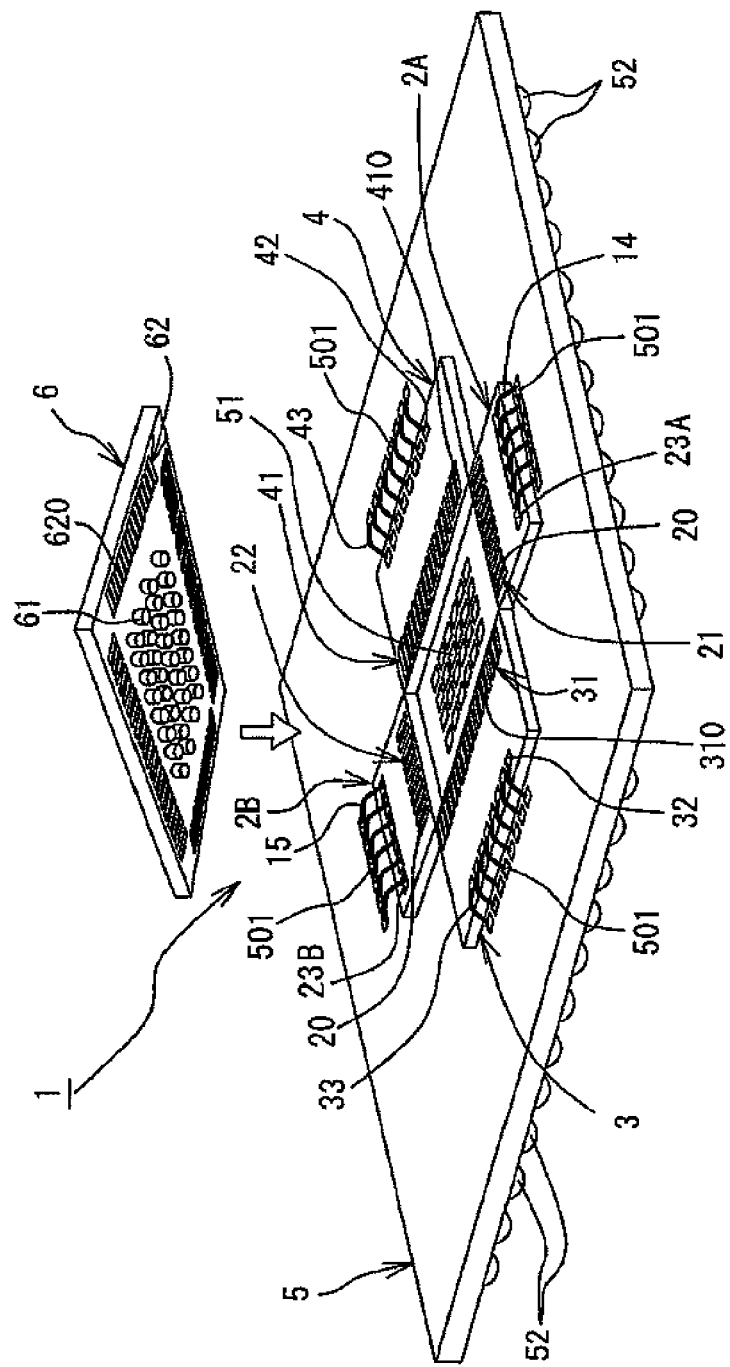
FIG. 2 is an exploded perspective view showing the semiconductor device shown in FIG. 1.

FIG. 1 is a perspective view showing a semiconductor device according to a first exemplary embodiment of the invention, and FIG. 2 is an exploded perspective view showing the semiconductor device shown in FIG. 1.

A semiconductor device 1 includes: memory ICs 2A and 2B; a optical I/O (input/output) circuit section 3; an I/F (interface) circuit section 4; a substrate (also referred to as an interposer) 5 on which the memory ICs 2A and 2B as examples of a first semiconductor chip, the optical I/O circuit section 3, and the I/F circuit section 4 (hereinafter, the optical I/O circuit section and the I/F circuit section are simply referred to as a "circuit section") are mounted and a land group 51 is provided in the middle; and an MPU (micro processor unit) 6 which has a plurality of solder balls 61 connected to the land group 51 and which is an example of a second semiconductor chip mounted on parts of the memory ICs 2A and 2B and circuit sections 3 and 4. In addition, the circuit sections 3 and 4 may be memory ICs with the same configuration as the memory ICs 2A and 2B.

For example, the memory ICs 2A and 2B are semiconductor memories, such as flash memories. In portions of the memory ICs 2A and 2B overlapping the MPU 6, electrode portions (first electrode portions) 21 and 22 in which a plurality of long electrodes 20 is arrayed in a comb shape are provided, respectively, as shown in FIG. 2. In addition, electrode groups 23A and 23B are provided at the opposite sides of the electrode portions 21 and 22 on the upper faces of the memory ICs 2A and 2B, respectively. Bonding wires 14 and 15 are connected to the electrode groups 23A and 23B, respectively.

The optical I/O circuit section 3 is an interface between optical transmission media, such as an optical fiber, and the MPU 6 and has a function of converting an optical signal into an electrical signal and a function of converting an electrical signal into an optical signal. In addition, an electrode portion (first electrode portion) 31 in which a plurality of electrodes 310 with the long plate shapes is arrayed in the comb shape is provided in a portion overlapping the MPU 6. In addition, an electrode group 32 is provided at the opposite side of the electrode portion 31 on the upper face of the optical I/O circuit section 3, and one end of a bonding wire 33 is connected to the electrode group 32.

The I/F circuit section 4 has a function of performing communication between the semiconductor device 1 and other circuit boards or the like, for example, a function of transmitting and receiving the data. In addition, an electrode portion (first electrode portion) 41 in which a plurality of electrodes 410 with long plate shapes is arrayed in the comb shape is provided in a portion overlapping the MPU 6. In addition, an electrode group 42 is provided at the opposite side of the electrode portion 41 on the upper face of the I/F circuit section 4, and one end of a bonding wire 43 is connected to the electrode group 42.

The substrate 5 has a base formed of an insulator, such as a ceramic, and a mounting space in which the memory ICs 2A and 2B and the circuit sections 3 and 4. In addition, the land group 51 and a plurality of land groups 501, to which the other ends of the bonding wires 14, 15, 33, and 43 are connected, are provided on the top face of the base of the substrate 5. A plurality of solder balls 52 used for connection with other circuit boards or the like is provided on the bottom face of the base.

(Configuration of an MPU)

Figure 3:
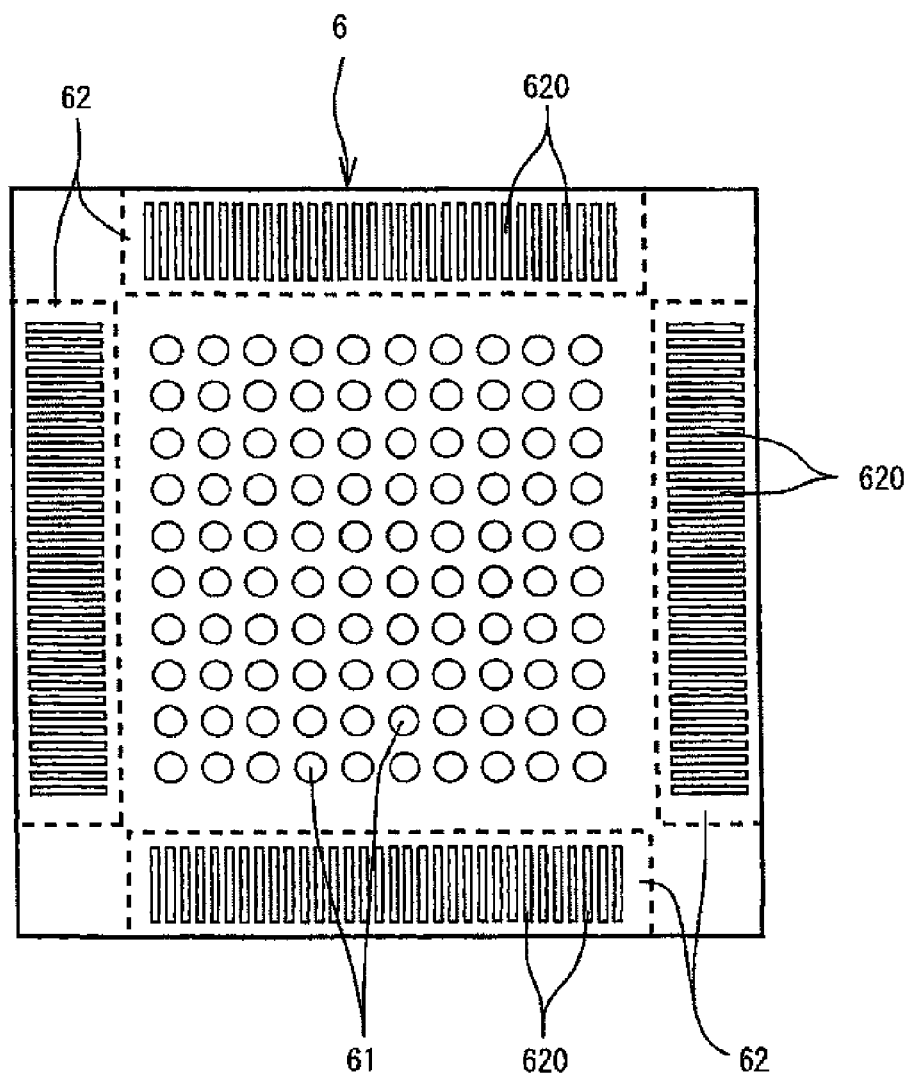
FIG. 3 is a view showing the configuration of a mounting face of an MPU shown in FIGS. 1 and 2.

FIG. 3 is a view showing the configuration of a mounting face of the MPU 6 shown in FIGS. 1 and 2. On the mounting face of the MPU 6, the plurality of solder balls 61 is provided in an array corresponding to the pattern of the land group 51 of the substrate 5, and four electrode portions 62 as a second electrode portion in which a plurality of electrodes 620 with the long plate shapes is arrayed in the comb shape are provided around the solder balls 61. In each electrode portion 62, each of the electrodes 620 has a long plate shape. Moreover, the four electrode portions 62 are disposed to face the electrodes of the electrode portions 21, 22, 31, and 41 shown in FIG. 1. For example, the length and width of each electrode 620 are 200 μm and 20 μm, respectively, and a distance between the electrodes 620 is 20 μm.

The solder balls 61 are used for middle-speed and low-speed transmission, power, and ground. In addition, the four electrode portions 62 are used for high-speed (for example, GHz band) transmission. Among the plurality of electrodes 620, the electrodes 620 for data transmission form a coplanar differential line.

FIG. 4A is a cross-sectional view taken along the line A-A of the semiconductor device shown in FIG. 1, and FIG. 4B is an enlarged view showing a B portion shown in FIG. 4A.

As shown in FIGS. 4A and 4B, one end of the solder ball 61 of the MPU 6 is connected to a land 63 provided on the mounting face of the MPU 6. On approximately the entire faces of the memory ICs 2A and 2B excluding the electrode groups 23A and 23B, a protective layer 12 formed of an insulating material, such as $SiO_2$, is provided. Moreover, the same protective layer 64 as the protective layer 12 is provided on the faces of the four electrode portions 62 of the MPU 6. The thickness of each of the protective layers 12 and 64 is 5 μm, for example. Accordingly, an insulating layer with a thickness of 10 μm is interposed between the electrode portion 21 and the electrode portion 62 and between the electrode portion 22 and the electrode portion 62.

In addition, either one of the protective layers 12 and 64 may be provided at one side. Moreover, instead of the protective layers 12 and 64, a dielectric or the like may be provided. In addition, the protective layer 12 may be provided only in portions adjacent to the four electrode portions 62. In addition, the same protective layer as the protective layer 12 may be provided in the optical I/O circuit section 3 and the I/F circuit section 4.

(Line Configuration Between Electrode Portions)

Figure 5:
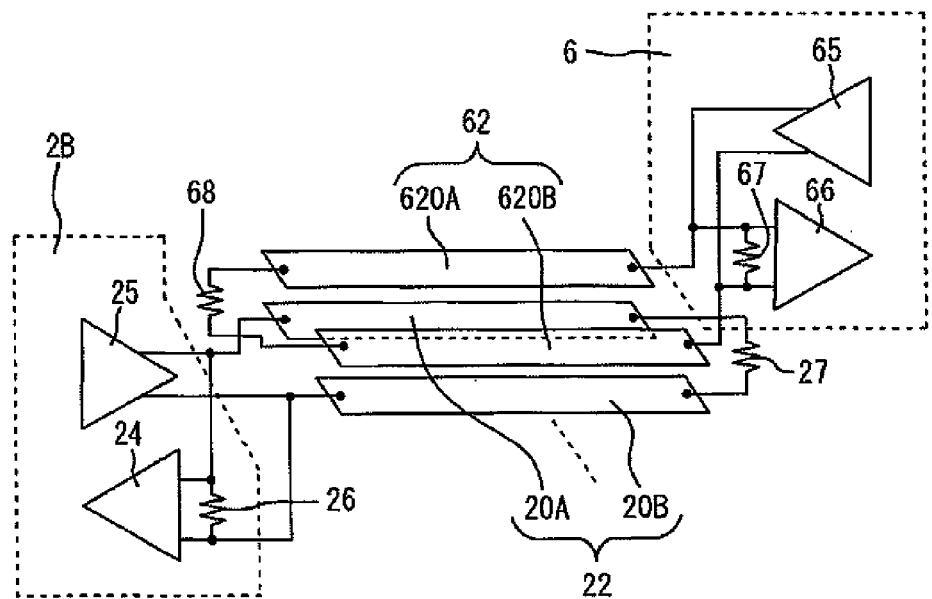
FIG. 5 is a view showing the arrangement relationship between an electrode portion of an MPU and an electrode portion of a semiconductor chip for peripheral circuits.

FIG. 5 is a view showing the arrangement relationship between the electrode portion 62 of the MPU 6 and an electrode portion of one semiconductor chip (memory IC) for peripheral circuits. Here, the arrangement when the communication between the MPU 6 and the memory IC 2B is performed is shown. Moreover, in FIG. 5, a differential line corresponding to one transmission line is shown and the other transmission lines are omitted. In the electrode portion 22 of the memory IC 2B, a pair of electrodes 20 which form the differential line are assumed to be electrodes 20A and 20B. Moreover, in the electrode portion 62 of the MPU 6, a pair of electrodes 620 which form the differential line are assumed to be electrodes 620A and 620B.

The memory IC 2B includes a differential signal receiving element 24 connected to the electrodes 20A and 20B which form the differential line of the electrode portion 22, a differential signal transmitting element 25 connected between one ends of the electrodes 20A and 20B (between differential input ends of the differential signal receiving element 24), a termination resistor 26 connected between the one ends of the electrodes 20A and 20B, and a termination resistor 27 connected between the other ends of the electrodes 20A and 20B.

The MPU 6 includes a differential signal transmitting element 65 connected to the electrodes 620A and 620B which form the differential line of the electrode portion 62, a differential signal receiving element 66 connected between one ends of the electrodes 620A and 620B (between operation output ends of the differential signal transmitting element 65), a termination resistor 67 connected between the one ends of the electrodes 620A and 620B, and a termination resistor 68 connected between the other ends of the electrodes 620A and 620B. Moreover, in FIG. 5, both the combination of the electrodes 620A and 620B and the combination of the electrodes 20A and 20B form coplanar differential transmission lines. In addition, the electrode arrangement shown in FIG. 5 is the same for the memory ICs 2A and 2B and the circuit sections 3 and 4.

The electrode portions 22 and 62 shown in FIG. 5 are coupled by both electric field (E) and magnetic field (H). Accordingly, compared with the known methods that uses only capacitive coupling or only magnetic coupling, it is advantageous in transmission of signal energy and the frequency characteristic is flatter than those in the known methods. In other words, since a structure close to a directional coupler is applied to a connecting portion between chips, the frequency characteristic is improved and becomes flat as a clock frequency becomes high. Accordingly, this is useful for further future improvement in the speed. In addition, the length of a region, in which the electric field and the magnetic field are coupled, of the connecting portion in the invention is shorter than the wavelength. Accordingly, it is possible to receive a signal regardless of a near end and a distant end.

(Fabrication of a Semiconductor Device)

Next, fabrication of a semiconductor device 1 will be described. First, the memory ICs 2A and 2B, the optical I/O circuit section 3, and the I/F circuit section 4 are positioned at predetermined places of the substrate 5 in a state where the electrode portions 21, 22, 31, and 41 face upward, and the memory ICs 2A and 2B, the optical I/O circuit section 3, and the I/F circuit section 4 are fixed to the substrate 5 by bonding or the like. Then, the electrode groups 23A, 23B, 32, and 42 on the memory ICs 2A and 2B, optical I/O circuit section 3, and I/F circuit section 4 are connected to the land group 51 on the substrate 5 by the bonding wires 14, 15, 33, and 43.

Then, the MPU 6 in which the solder balls 61 are provided beforehand in the land 63 is prepared. The MPU 6 is positioned above the land group 51 of the substrate 5 in a state where the electrode portion 62 faces downward. In this state, the solder balls 61 and the land group 51 are disposed so as to overlap each other, and the electrode portion 62 and the electrode portions 21, 22, 31, and 41 are disposed so as to overlap each other. Then, the solder balls 61 are melted to be connected to the land group 51. In this case, the MPU 6 is self-aligned by surface tension when the solder balls 61 melt.

(Operation of a Semiconductor Device)

Next, an operation of the semiconductor device 1 will be described.

(1) Transmission from the differential signal transmitting element 65 to the differential signal receiving element 24

In the case where a differential data signal is output from the differential signal transmitting element 65, the differential data signal is applied to the termination resistor 67 and the differential signal receiving element 66 and is also output to the electrodes 620A and 620B. Then, the differential data signal output to the electrodes 620A and 620B flows to the termination to be terminated by the termination resistor 68.

At the same time, the differential data signal from the differential signal transmitting element 65 is transmitted to the electrodes 20A and 20B, which are coupled with the electrodes 620A and 620B mainly by capacitive coupling and inductive coupling, and flows to both ends of the electrodes 20A and 20B. Then, the differential data signal is terminated by the termination resistor 27 at the right ends of the electrodes 20A and 20B and terminated by the termination resistor 26 at the left ends and is also input to the differential signal receiving element 24. The differential data signal input to the differential signal receiving element 24 is subjected to signal processing and the like after being amplified in the differential signal receiving element 24.

(2) Transmission from the differential signal transmitting element 25 to the differential signal receiving element 66

Next, in the case where a differential data signal is output from the differential signal transmitting element 25, the differential data signal is applied to the termination resistor 26 and the differential signal receiving element 24 and also flows through the electrodes 20A and 20B to be then terminated by the termination resistor 27.

At the same time, the differential data signal from the differential signal transmitting element 25 flows to both ends of the electrodes 620A and 620B, which are coupled with the electrodes 20A and 20B mainly by capacitive coupling and inductive coupling. Then, the differential data signal is terminated by the termination resistor 68 at the left ends of the electrodes 620A and 620B and terminated by the termination resistor 67 at the right ends and is also input to the differential signal receiving element 66. The differential data signal input to the differential signal receiving element 66 is subjected to data demodulation processing and the like after being amplified in the differential signal receiving element 66. The above-described communication is similarly performed between the electrode portion 62 of the MPU 6 and each of the electrode portions 21, 31, and 41 of the memory IC 2B, optical I/O circuit section 3, and I/F circuit section 4.

[Second Exemplary Embodiment]

Figure 6:
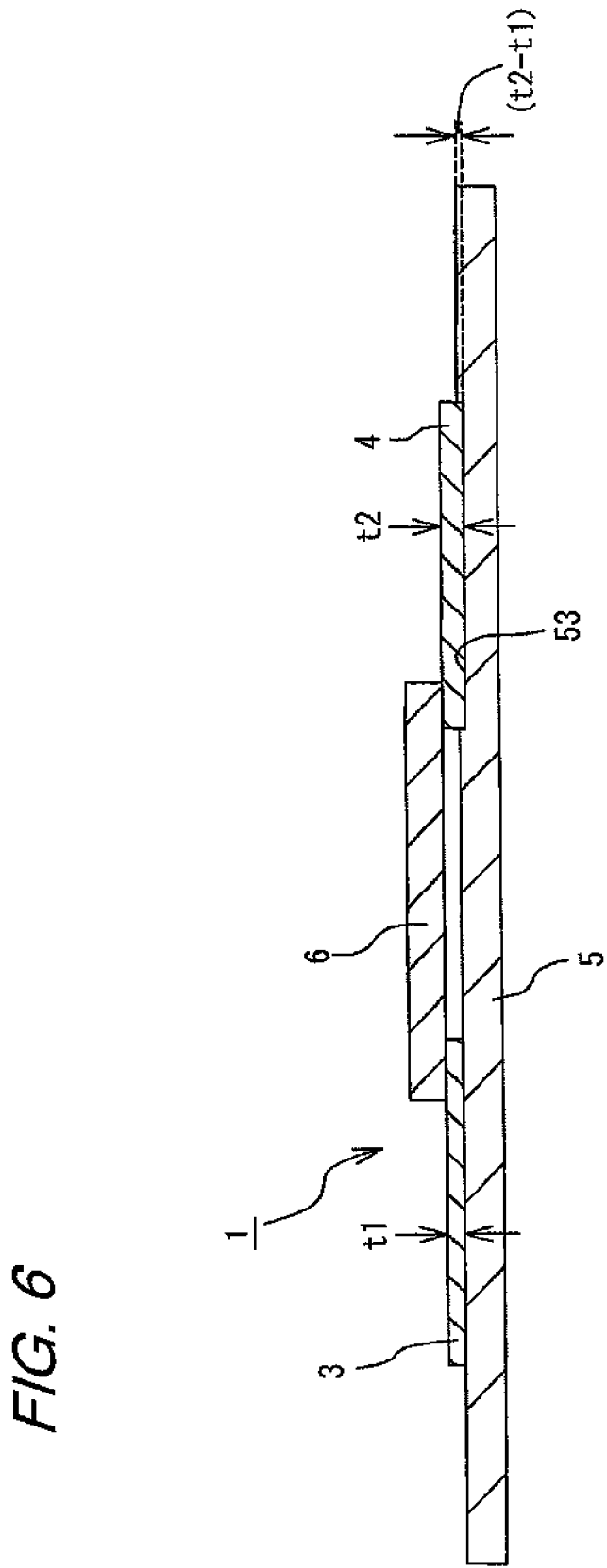
FIG. 6 is a cross-sectional view showing a semiconductor device according to a second exemplary embodiment of the invention.

FIG. 6 is a cross-sectional view showing a semiconductor device according to a second exemplary embodiment of the invention. Moreover, in FIG. 6, the bonding wires 14 and 15, the electrode groups 23A and 23B, the solder balls 52, and the land groups 51 and 501 are not shown. In the present exemplary embodiment, one of the memory ICs 2A and 2B, the optical I/O circuit section 3, and the I/F circuit section 4 in the first exemplary embodiment has a different height (thickness) from the other three ones, and a recess 53 with approximately the same size as the outer shape of the I/F circuit section 4 is provided in the substrate 5 in order to make the height of the one with a different height (here, the I/F circuit section 4) equal to the face heights of the other three ones. The other configurations are the same as those of the first exemplary embodiment.

As shown in FIG. 6, assuming that the thickness of each of the memory ICs 2A and 2B and the optical I/O circuit section 3 is t1 and the thickness of the I/F circuit section 4 is t2 (t2>t1), the depth of the recess 53 is (t2−t1) and the face heights of the memory ICs 2A and 2B, optical I/O circuit section 3, and I/F circuit section 4 from the substrate 5 are equal. In addition, without providing the recess 53, the back face or top face of the I/F circuit section 4 may be polished so that the thickness of the I/F circuit section 4 becomes t1. In addition, when a plurality of peripheral circuit semiconductor chips with different thicknesses exists, the recesses 53 are formed to have the depths at which the thickness of the peripheral circuit semiconductor chip with a minimum thickness is equal to the face height.

[Third Exemplary Embodiment]

Figure 7A:
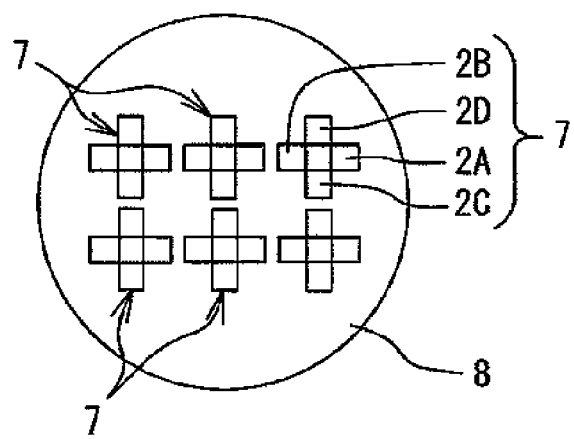
FIGS. 7A to 7D show a process of manufacturing a semiconductor device according to a third exemplary embodiment of the invention, where
Figure 7B:
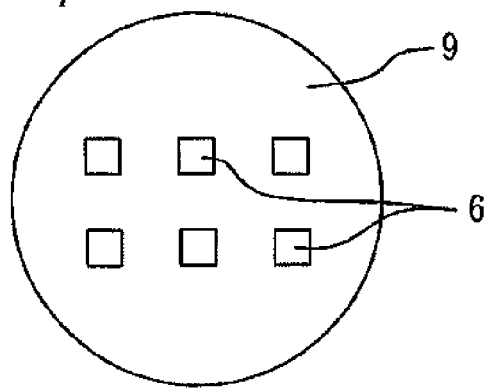
Figure 7C:
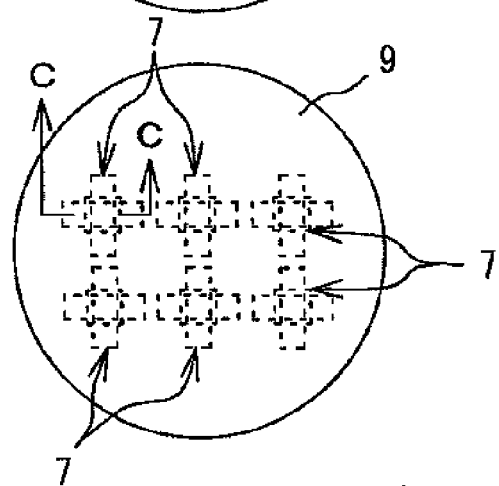
Figure 7D:
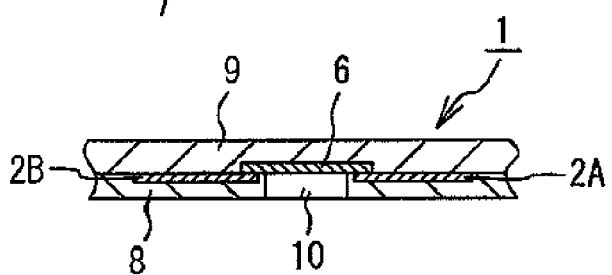

FIGS. 7A to 7D show a process of manufacturing a semiconductor device according to a third exemplary embodiment of the invention. FIG. 7A is a plan view showing a state where semiconductor chip groups other than an MPU are provided in a first wafer. FIG. 7B is a plan view showing a state where an MPU group is provided in a second wafer. FIG. 7C is a plan view showing a state where the two wafers are bonded to each other. FIG. 7D is a cross-sectional view taken along the line C-C in a completed semiconductor device of FIG. 7C.

In the present exemplary embodiment, semiconductor chips are separately manufactured in two wafers formed of Si, for example, and a plurality of semiconductor devices 1 is simultaneously provided in one wafer by simultaneously aligning all of the semiconductor chips by wafer-to-wafer alignment, thereby forming a semiconductor device 100.

Hereinafter, the manufacturing method will be described. As shown in FIG. 7A, a plurality of (here, six) peripheral circuit sections 7, each of which includes four memory ICs 2A to 2D shown in the first exemplary embodiment, is formed in a first wafer 8. The height of the face of each of the memory ICs 2A to 2D is almost equal to that of the face of the first wafer 8.

Then, as shown in FIG. 7B, the plurality of (here, six) MPUs 6 shown in the first exemplary embodiment is formed in a second wafer 9. The height of the face of each of the MPUs 6 is almost equal to that of the face of the second wafer 9.

Then, as shown in FIG. 7C, the memory ICs 2A to 2D and the MPU 6 are aligned as described in the first exemplary embodiment under conditions in which the semiconductor chip mounted faces of the first and second wafers 8 and 9 face each other, the two wafers 8 and 9 are bonded to each other by adhesive or the like, and flip chip mounting is performed.

Then, as shown in FIG. 7D, an opening 10 is formed in a portion of the first wafer 8 facing the MPU 6. Then, the six semiconductor devices 1 are cut in the predetermined size by a stealth dicing method, for example. This cutting is performed to make different shapes in the first and second wafers 8 and 9.

Then, the solder ball 61 is provided on the bottom face of the MPU 6 so as to be positioned in the opening 10. Then, they are mounted on a substrate.

Thus, the plurality of semiconductor devices 1 can be simultaneously formed by the process of manufacturing one semiconductor device. Moreover, in the third exemplary embodiment, alignment of the first and second wafers 8 and 9 may also be performed using the X-ray fluoroscopy or the like.

[Fourth Exemplary Embodiment]

Figure 8A:
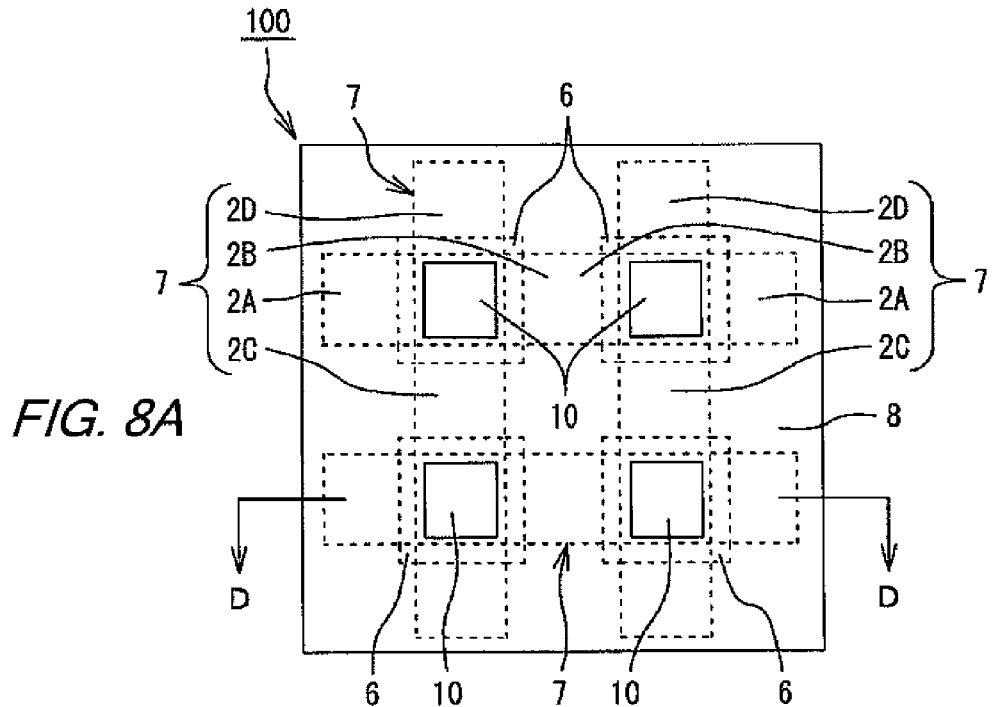
FIGS. 8A and 8B show a semiconductor device according to a fourth exemplary embodiment of the invention, where
Figure 8B:
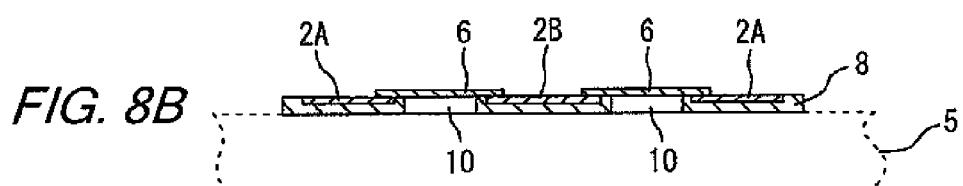

FIGS. 8A and 8B show a semiconductor device according to a fourth exemplary embodiment of the invention. FIG. 8A is a bottom view, and FIG. 8B is a cross-sectional view taken along the line D-D. Moreover, in FIGS. 8A and 8B, a solder ball, a land group, a bonding wire, and the like are not shown.

In the present exemplary embodiment, the semiconductor device 100 is formed by providing the plurality of (here, four) peripheral circuit sections 7 shown in the third exemplary embodiment in the first wafer 8 and mounting the MPU 6 on each of the peripheral circuit sections 7. The other configurations are the same as those of the first exemplary embodiment.

In the semiconductor device 100, the memory ICs 2A to 2D as the peripheral circuit section 7 are provided in the first wafer 8. Moreover, as shown in FIG. 8A, the region including the four peripheral circuit sections 7 is cut from the first wafer 8 by the stealth dicing method or the like and each of the plurality of (here, four) MPUs 6 manufactured separately is mounted in the middle of each of the four peripheral circuit sections 7 like the first exemplary embodiment, thereby forming the semiconductor device 100. In addition, an opening 10 for making the solder ball 61 shown in FIGS. 4A and 4B connectable to the land group 51 is provided in the first wafer 8 as shown in FIG. 8B.

[Fifth Exemplary Embodiment]

Figure 9A:
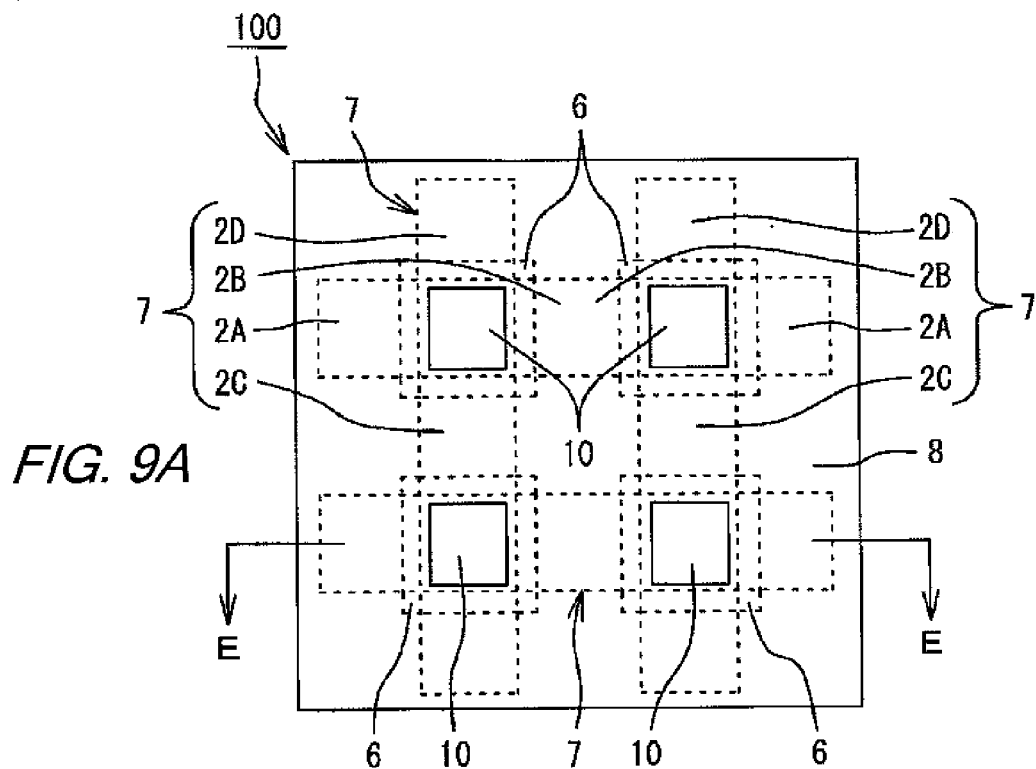
FIGS. 9A and 9B show a semiconductor device according to a fifth exemplary embodiment of the invention, where
Figure 9B:
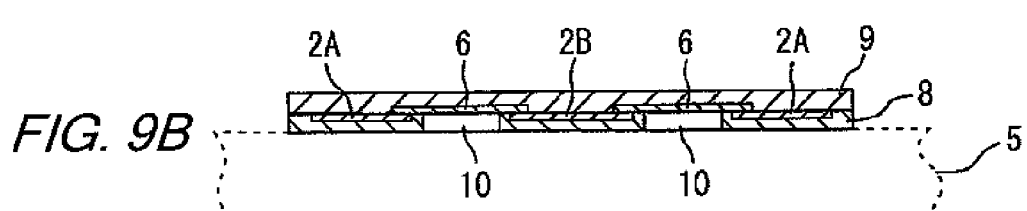

FIGS. 9A and 9B show a semiconductor device according to a fifth exemplary embodiment of the invention. FIG. 9A is a bottom view, and FIG. 9B is a cross-sectional view taken along the line E-E.

In the present exemplary embodiment, the plurality of (here, four) MPUs 6 in the fourth exemplary embodiment is mounted in the peripheral circuit sections 7 in a state of being integrally formed in the second wafer 9 as shown in FIG. 7B of the third exemplary embodiment. The other configurations are the same as those of the fourth exemplary embodiment.

In addition, although the semiconductor device 100 is configured to include the four semiconductor devices 1 in the fourth and fifth exemplary embodiments, the semiconductor device 100 may be configured to include one to three (three openings 10) or five or more semiconductor devices 1.

[Sixth Exemplary Embodiment]

Figure 10:
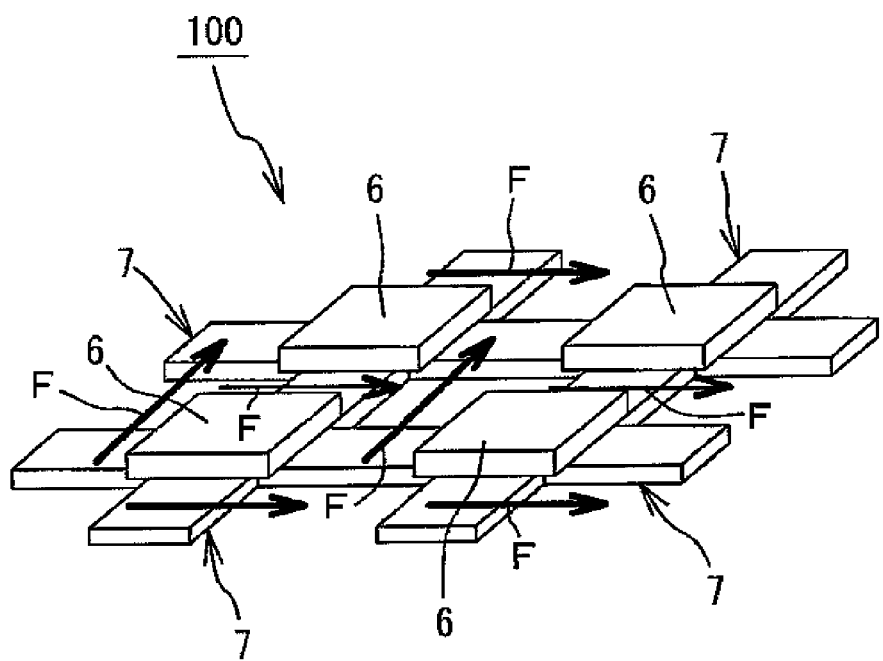
FIG. 10 is a perspective view showing a semiconductor device according to a sixth exemplary embodiment of the invention.

FIG. 10 is a perspective view showing a semiconductor device according to a sixth exemplary embodiment of the invention. In the present exemplary embodiment, the flow F of cooling gas or cooling liquid (not shown) is formed around the four MPUs 6 and in portions of the four peripheral circuit sections 7 where the MPUs 6 are not mounted in the fourth exemplary embodiment, so that the MPUs 6 and the peripheral circuit sections 7 are cooled. The other configurations are the same as those of the first exemplary embodiment. As a means for forming the flow F, for example, a screen-like air channel may be provided or a plate-like lid may be provided above the MPU 6.

[Other Exemplary Embodiments]

The invention is not limited to the above-described exemplary embodiments, and various modifications may be made within the scope without departing from the subject matter or spirit of the invention. In addition, the constituent components of the exemplary embodiments may be arbitrarily combined within the scope without departing from the subject matter or spirit of the invention.

In addition, in the first and second exemplary embodiments, the memory ICs 2A and 2B and the circuit sections 3 and 4 are not limited to the configurations for such applications and may be formed by semiconductor chips which have functions or circuits for other applications. Similarly, in the third to fifth exemplary embodiments, the peripheral circuit section 7 is not limited to the memory ICs 2A and 2B and the circuit sections 3 and 4.

The foregoing description of the exemplary embodiment of the present invention has been provided for the purpose of illustration and description. It is not intended to be exhaustive or to limit the invention to the precise forms disclosed. Obviously, many modifications and various will be apparent to practitioners skilled in the art. The embodiments were chosen and described in order to best explain the principles of the invention and its practical application, thereby enabling other skilled in the art to understand the invention for various embodiments and with the various modifications as are suited to the particular use contemplated. It is intended that the scope of the invention be defined by the following claims and their equivalents.

What is claimed is:

1. A semiconductor device comprising:
a substrate that has a plurality of first lands;
a first semiconductor chip that has a first electrode portion including a plurality of first electrodes, the first semiconductor chip disposed adjacent to the plurality of the first lands on the substrate; and
a second semiconductor chip that has a plurality of second lands and a second electrode portion including a plurality of second electrodes, the plurality of the second lands surrounded by the plurality of the second electrodes, and the second semiconductor chip disposed on the first semiconductor chip,
wherein data is transmitted between the first electrode portion and the second electrode portion in a non-contact manner, and
the plurality of the first lands are electrically connected to the plurality of the second lands via solder balls.

2. The semiconductor device according to claim 1, wherein at least one of the first electrode portion and the second electrode portion is covered by an insulating layer.

3. The semiconductor device according to claim 1, wherein each of the first electrode portion and the second electrode portion includes an electrode for a differential transmission line.

4. A semiconductor device comprising:
a first wafer that has a plurality of first lands;
a first semiconductor chip that has a first electrode portion including a plurality of first electrodes, the first semiconductor chip formed adjacent to the plurality of the first lands on the first wafer; and
a second semiconductor chip that has a plurality of second lands and a second electrode portion including a plurality of second electrodes, the plurality of the second lands surrounded by the plurality of the second electrodes, and the second semiconductor chip disposed on the first semiconductor chip,
wherein data is transmitted between the first electrode portion and the second electrode portion in a non-contact manner, and
the plurality of the first lands are electrically connected to the plurality of the second lands via solder balls.

5. The semiconductor device according to claim 4, wherein the second semiconductor chip is formed on a second wafer, and
the second wafer is stacked on the first wafer so that the first electrode portion faces the second electrode portion through an insulation layer.

6. The semiconductor device of claim 4, wherein the plurality of the first lands are enclosed on at least one side by the first semiconductor chip.

7. The semiconductor device of claim 1, wherein the plurality of the first lands are enclosed on at least one side by the first semiconductor chip.

* * * * *